Figure 1:
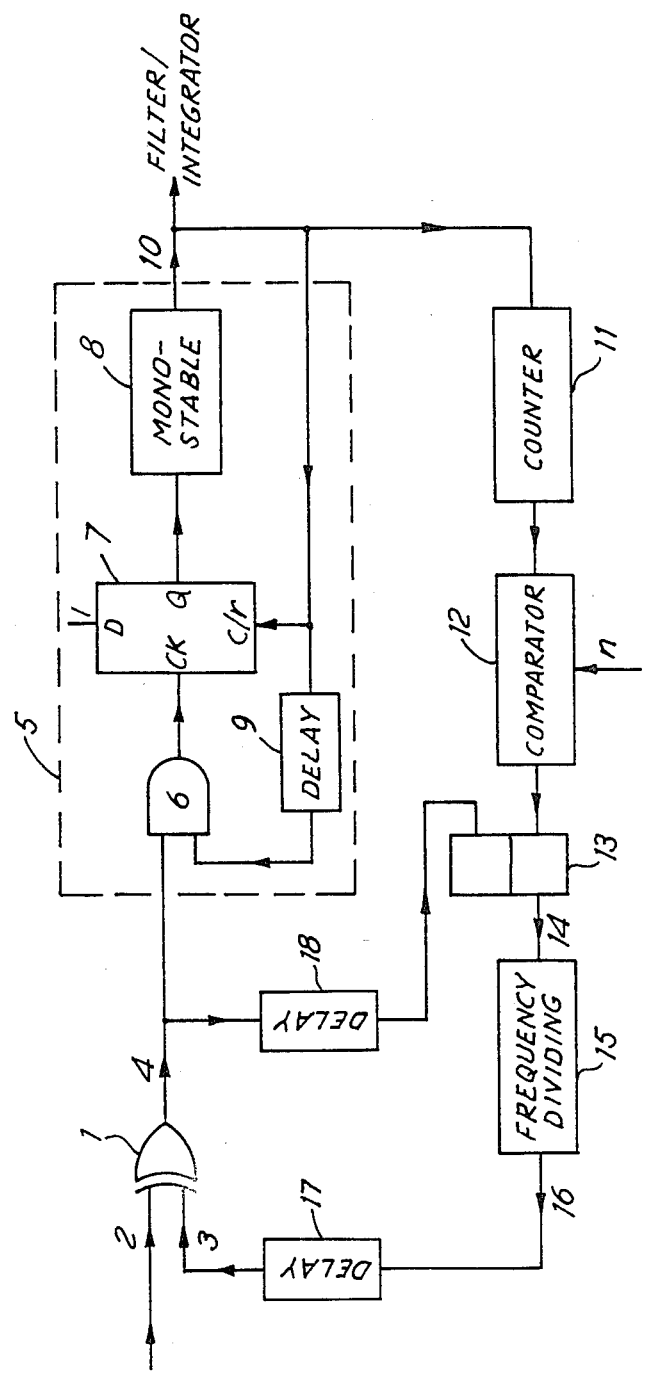

United States Patent [19]

Rogers

[11] Patent Number: 4,777,450

[45] Date of Patent: Oct. 11, 1988

[54] CIRCUIT FOR DEMODULATING A FREQUENCY-MODULATED SIGNAL

[75] Inventor: Michael J. Rogers, Bristol, England

[73] Assignee: Thorn Emi Datatech Limited, Feltham, England

[21] Appl. No.: 55,064

[22] Filed: May 28, 1987

[30] Foreign Application Priority Data

May 30, 1986 [GB] United Kingdom ............... 8613167

[51] Int. Cl.$^4$ ..................... H03D 3/04; H03D 3/20; H03K 9/06
[52] U.S. Cl. .................................... 329/107; 329/126
[58] Field of Search ............... 329/103, 107, 110, 122, 329/126, 128; 375/80, 82, 94; 455/214; 360/30

[56] References Cited

U.S. PATENT DOCUMENTS

| | | | |
|---|---|---|---|
| 2,956,227 | 11/1960 | Pierson | 329/128 X |
| 3,638,128 | 1/1972 | Downs | 329/103 X |
| 4,091,330 | 5/1978 | Hidaka | 329/107 |
| 4,350,957 | 9/1982 | Miyamoto | 329/107 |

Primary Examiner—Siegfried H. Grimm
Attorney, Agent, or Firm—Fleit, Jacobson, Cohn & Price

[57] ABSTRACT

A demodulating circuit includes an exclusive OR gate which has a first input for a frequency modulated signal and a second input connected via a delay to a frequency dividing circuit. The second input is initially low so that an output signal is produced by the gate, enabling a pulse generator, whenever the first input is high. The pulse generator produces a train of pulses of predetermined length and frequency. These pulses are counted in a counter and the count is compared in a comparator with a predetermined number n. On the $n^{th}$ pulse, the comparator sets a bistable circuit which then produces an end-of-pulse-train signal, triggering the frequency dividing circuit. In response, the frequency dividing circuit produces an output signal which causes the second input of the OR gate to go high, thereby disabling the pulse generator. The pulse generator is then re-enabled when the first input of the gate goes low, thereby indicating a zero-cross-over point, in the negative-going direction, of the frequency-modulated signal. The demodulated signal is produced by filtering and integrating successive pulse trains produced by the pulse generator.

4 Claims, 2 Drawing Sheets

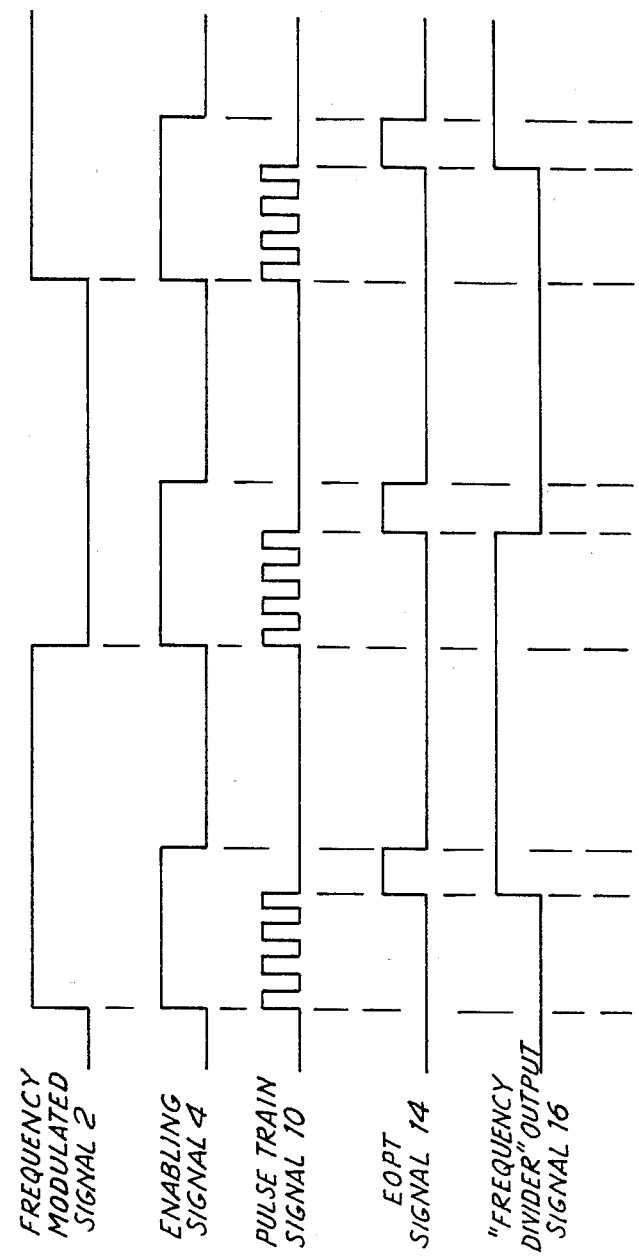

CIRCUIT FOR DEMODULATING A FREQUENCY-MODULATED SIGNAL

This invention relates to a circuit for demodulating a frequency-modulated signal and in particular, though not exclusively, to such a circuit for use in apparatus for reproducing recorded data.

In demodulation of the recorded frequency-modulated signal, the signal is generally shaped by a limiter amplifier from a sinusoidal to a substantially symmetrical square waveform and is then passed to a differentiator which generates a spike at each positive-going and/or negative-going zero-cross-over point of the waveform. A pulse generator is enabled by each spike and generates a train of pulses, the number of which is predetermined by the carrier frequency of the frequency-modulated signal. After generation of the pulse train, the pulse generator is disenabled until another spike is generated, which re-enables the pulse generator. The successive trains of pulses are then filtered and integrated to produce an analogue output signal representing the modulation originally imposed on the carrier signal.

However, differentiators, which are used to detect positive-going and/or negative-going zero-cross-over points of the frequency-modulated signal, tend to be inherently more sensitive to signals of higher frequency, which renders them unduly sensitive to noise.

Moreover, at low carrier frequencies, this problem is enhanced by a reduction in signal sensitivity of the differentiator, because its sensitivity to signal is a function of the slope of the signal.

The combination of higher sensitivity to noise and lower sensitivity to signal provides an overall reduction in the signal-to-noise ratio at demodulation, which consequently produces an undesirable reduction in signal-to-noise ratio of the output signal.

It is therefore an object of the present invention to provide a circuit for demodulating a frequency-modulated signal, which substantially alleviates the above-mentioned problems associated with known demodulating circuits.

In accordance with the present invention there is provided a circuit for demodulating a frequency-modulated signal, said circuit including means for generating pulses at a predetermined frequency, logic means for comparing the frequency-modulated signal with a reference voltage level to detect a predetermined characteristic of said signal and for enabling said pulse generating means in response to said detection, means for disenabling said pulse generating means upon generation of a predetermined number of said pulses, and means for integrating the pulses generated as a result of successive detections.

Depending on the reference voltage level, the logic means may therefore be arranged to detect zero-cross-over points of the frequency-modulated signal either in the positive-going or negative-going direction.

Preferably, however, the circuit includes means for changing the reference voltage level between each half cycle of the frequency-modulated signal so that the logic means is capable of detecting zero-cross-over points of the frequency-modulated signal in both the positive-going and negative-going directions.

The invention will now be further described by way of example only with reference to the accompanying drawings, wherein:

FIG. 1 shows on embodiment of the invention, and
FIG. 2 shows the waveform at various points of the circuit shown in FIG. 1.

Referring to the Figures, the circuit includes an exclusive OR gate 1, which has an input 2 for a frequency-modulated signal, in the form of a substantially square wave, to be demodulated. An input 3 of the gate 1 is initially low so that when the frequency-modulated signal input 2 is high, an enabling signal 4 is generated which enables a pulse generator 5.

The pulse generator 5, which is known, consists of a loop, including an AND gate 6, a D-type flip-flop 7, a monostable 8 and a delay 9, which forms an oscillator to generate a train of pulses each of length defined by the monostable 8 and of frequency defined by the delay 9, as shown by signal 10 in FIG. 2.

The pulse train signal 10 is passed to a counter 11, which counts the number of pulses generated, and a comparator 12, which compares the number counted with a predetermined number n. The number n, which may be one or more, is dependent on the carrier frequency of the frequency-modulated signal and is variable so that the demodulating circuit effectively sees the same number of pulses per second, irrespective of the carrier frequency.

On the nth pulse, the comparator 12 sets a bistable circuit 13 to produce an "end of pulse train" (EOPT) signal 14, as shown in FIG. 2, which then triggers a "frequency divider" circuit 15. Output 16 of the circuit 15 then causes input 3 of the exclusive OR gate 1 to go high, after a delay 17.

As the frequency-modulated signal input 2 is still high, the gate 1 ceases to generate the enabling signal 4, after a delay inherent in the circuit, thereby disenabling the pulse generator 5. The end of the enabling signal 4 also resets the bistable circuit 13 after a delay 18.

The circuit then remains in this state until the frequency-modulated signal input 2 of the gate 1 goes low, thereby indicating a zero-cross-over point, in the negative-going direction, of the frequency-modulated signal. This change of state is detected by the gate 1 because input 3 is still high, and the gate 1 generates another enabling signal 4, which re-enables the pulse generator 5.

After generation of another pulse train of n pulses, the input 3 of the gate 1 again goes low, so that the gate 1 is now ready to detect when input 2 goes high again, which indicates the next zero-cross-over point of the frequency-modulated signal in the positive-going direction.

A train of n pulses is therefore generated at each zero-cross-over point of the frequency-modulated signal and signal 10 of the successive pulse trains is passed to a filter (not shown) and an integrating circuit (also not shown) to produce an analogue signal representing the modulation originally imposed on the carrier frequency of the frequency-modulated signal.

The above circuit can therefore detect each zero-cross-over point of the frequency-modulated signal both in positive-going and negative-going directions by the inclusion, together with the logic gate 1, of the "frequency-divider" circuit 15, which changes state, and therefore changes the input of gate 1, at the end of each pulse train.

However, as an alternative to this arrangement, the circuit may be arranged to detect either only positive-going or only negative-going zero-cross-over points of the frequency-modulated signal.

To this end, the circuit as shown in FIG. 1, can be modified by removing the "frequency divider" circuit 15 and applying a constant low to input 3 of gate 1 or by replacing gate 1 with an AND gate (not shown) with a high signal applied to its input, to detect positive-going zero-cross-over points. To detect negative-going zero-cross-over points, a constant high input 3 would be applied to the gate 1 or a low input if the exclusive OR gate 1 was replaced by an AND gate (not shown). With any of these alternative arrangements, an additional AND gate (not shown) controlled by the bistable circuit 13 would be required between the exclusive OR gate 1 and the D-type flip-flop 7.

By use of the logic gate 1 to detect zero-cross-over points of the frequency-modulated signal, the present invention thus provides a demodulating circuit, which avoids the use of a differentiator, thereby reducing the susceptibility of the circuit to a reduction in the noise-to-signal ratio.

I claim:

1. A circuit for demodulating a frequency-modulated signal, said circuit including means for generating pulses at a predetermined frequency, logic means for comparing the frequency-modulated signal with a reference voltage level to detect a predetermined characteristic of said signal and for enabling said pulse generating means in response to said detection, means for disenabling said pulse generating means upon generation of a predetermined number of said pulses, and means for integrating the pulses generated as a result of successive detections.

2. A circuit as claimed in claim 1 wherein the logic means is arranged to detect zero-cross-over points of the frequency-modulated signal.

3. A circuit as claimed in claim 2 and including means for changing the reference voltage level between each half cycle of the frequency-modulated signal, so that the logic means is capable of detecting zero-cross-over points of the frequency-modulated signal both in the positive-going and negative-going directions.

4. A circuit as claimed in claim 3 wherein said means for changing the voltage reference level comprises a "frequency-divider" circuit arranged to change state at the end of each generation of said predetermined number of pulses, said change of state being arranged to cause said change in the voltage reference level.

* * * * *